United States Patent [19]

Krol

[11] 4,402,045
[45] Aug. 30, 1983

[54] MULTI-PROCESSOR COMPUTER SYSTEM
[75] Inventor: Thijs Krol, Eindhoven, Netherlands
[73] Assignee: U.S. Philips Corporation, New York, N.Y.
[21] Appl. No.: 216,118
[22] Filed: Dec. 15, 1980
[30] Foreign Application Priority Data
Dec. 20, 1979 [NL] Netherlands ............... 7909178
[51] Int. Cl.³ .......................................... G06F 11/18
[52] U.S. Cl. ............................... 364/200; 371/68
[58] Field of Search ............ 364/200 MS File; 371/2, 371/36, 68

[56] References Cited
U.S. PATENT DOCUMENTS
4,030,074 6/1977 Giorcelli ........................ 364/200

Primary Examiner—Thomas M. Heckler
Attorney, Agent, or Firm—James J. Cannon, Jr.

[57] ABSTRACT

A multiprocessor computer system is distributed over error isolation areas, each of these areas containing a processor element, an encoder, a section of a memory and an information reconstruction section which are connected in this order in a cyclic path. The processor elements work in parallel on the same data word, which has a certain length. When the result of the processing has to be stored in the memory, each encoder forms a code symbol of shorter length, on the basis of the data word. The set of code symbols formed on the basis of the data word forms a code word with a larger bit length than the data word mentioned. By means of an error correcting code at least one erroneous code symbol in the code word can be corrected. The code symbols are stored in the respective memory sections. If the data word concerned has to be further processed, all corresponding code symbols are fed to all information reconstruction sections. Peripheral equipment can be connected in the cyclic path, with implementation of distinctive levels of redundancy.

13 Claims, 14 Drawing Figures

| | | | | | | | | | | | | | | | | | | | |
|---|---|---|---|---|---|---|---|---|---|---|---|---|---|---|---|---|---|---|---|
| 0 | 0 | 0 | 0 | 0 | $a^3$ | 1 | 0 | 0 | 0 | $a^7$ | 1 | 0 | 1 | 1 | $a^{11}$ | 1 | 1 | 1 | 0 |
| $a^0$ | 0 | 0 | 0 | 1 | $a^4$ | 0 | 0 | 1 | 1 | $a^8$ | 0 | 1 | 0 | 1 | $a^{12}$ | 1 | 1 | 1 | 1 |
| $a^1$ | 0 | 0 | 1 | 0 | $a^5$ | 0 | 1 | 1 | 0 | $a^9$ | 1 | 0 | 1 | 0 | $a^{13}$ | 1 | 1 | 0 | 1 |
| $a^2$ | 0 | 1 | 0 | 0 | $a^6$ | 1 | 1 | 0 | 0 | $a^{10}$ | 0 | 1 | 1 | 1 | $a^{14}$ | 1 | 0 | 0 | 1 |
| | | | | | | | | | | | | | | | $a^{15}$ | 0 | 0 | 0 | 1 |

$$\vec{c} = [G]\cdot\vec{a}$$

$$\begin{bmatrix} C31 \\ C30 \\ C21 \\ C20 \\ C11 \\ C10 \\ C01 \\ C00 \end{bmatrix} = \begin{bmatrix} 1 & 0 & 1 & 0 \\ 0 & 1 & 0 & 1 \\ 1 & 0 & 1 & 1 \\ 0 & 1 & 1 & 0 \\ 1 & 0 & 0 & 0 \\ 0 & 1 & 0 & 0 \\ 0 & 0 & 1 & 0 \\ 0 & 0 & 0 & 1 \end{bmatrix} \cdot \begin{bmatrix} a11 \\ a10 \\ a01 \\ a00 \end{bmatrix}$$

FIG.2a

$$\begin{bmatrix} C31 \\ C30 \end{bmatrix} = \begin{bmatrix} 1 & 0 & 1 & 0 \\ 0 & 1 & 0 & 1 \end{bmatrix} \cdot \begin{bmatrix} a11 \\ a10 \\ a01 \\ a00 \end{bmatrix}$$

FIG.2b

$$\begin{bmatrix} C21 \\ C20 \end{bmatrix} = \begin{bmatrix} 1 & 0 & 1 & 1 \\ 0 & 1 & 1 & 0 \end{bmatrix} \cdot \begin{bmatrix} a11 \\ a10 \\ a01 \\ a00 \end{bmatrix}$$

FIG.6b $$[H] = \begin{bmatrix} 1 & 1 & 1 & 1 & 1 & 1 & 1 & 1 \\ 1 & \underline{a} & \underline{a}^2 & \underline{a}^3 & \underline{a}^4 & \underline{a}^5 & \underline{a}^6 & \underline{a}^7 \\ 1 & \underline{a}^2 & \underline{a}^4 & \underline{a}^6 & \underline{a}^8 & \underline{a}^{10} & \underline{a}^{12} & \underline{a}^{14} \\ 1 & \underline{a}^3 & \underline{a}^6 & \underline{a}^9 & \underline{a}^{12} & 1 & \underline{a}^3 & \underline{a}^6 \end{bmatrix}$$

FIG.7a

$$[H] = \begin{bmatrix} 1 & 0 & 0 & 0 & 1 & 0 & 0 & 1 & 1 & 0 & 1 & 0 \\ 0 & 1 & 0 & 0 & 1 & 1 & 0 & 1 & 0 & 1 & 1 & 1 \\ 0 & 0 & 1 & 0 & 0 & 1 & 1 & 0 & 1 & 0 & 1 & 1 \\ 0 & 0 & 0 & 1 & 0 & 0 & 1 & 1 & 0 & 1 & 0 & 1 \end{bmatrix}$$

FIG.7b

$$[G] = \begin{bmatrix} 1 & 0 & 0 & 1 & 1 & 1 & 1 & 0 \\ 1 & 1 & 0 & 1 & 0 & 1 & 1 & 1 \\ 0 & 1 & 1 & 0 & 1 & 0 & 1 & 1 \\ 0 & 0 & 1 & 1 & 0 & 1 & 0 & 1 \\ 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \end{bmatrix}$$

FIG.7c

$$[H_1] = \begin{bmatrix} 1 & 1 & 1 & 0 & 0 \\ 1 & a^1 & 0 & 1 & 0 \\ 1 & a^2 & 0 & 0 & 1 \end{bmatrix} \qquad [G] = \begin{bmatrix} 1 & 0 \\ 0 & 1 \\ 1 & 1 \\ 1 & a^1 \\ 1 & a^2 \end{bmatrix}$$

FIG.7d

$$[H_2] = \begin{bmatrix} 1 & a & a^2 \\ 0 & 1 & 1 \\ 0 & a^2 & a \end{bmatrix} \cdot [H_1] = \begin{bmatrix} 0 & 0 & 1 & a & a^2 \\ 0 & 1 & 0 & 1 & 1 \\ 1 & 0 & 0 & a^2 & a \end{bmatrix}$$

FIG.7e

MULTI-PROCESSOR COMPUTER SYSTEM

BACKGROUND OF THE INVENTION

The invention relates to a multi-processor computer system containing a number n (n>2) of processor elements operating in parallel, each of which have a first data input and a first data output, which computer system further includes a memory with second data inputs to receive information appearing on the data outputs mentioned above and to store this information temporarily and also with second data outputs to present information to the first data inputs mentioned, whereby a closed path can be formed, containing an information-reconstruction device to receive, reconstruct and re-inject all the information circulating in the closed path on the basis of an error-correcting code.

DESCRIPTION OF THE PRIOR ART

All information processing is subject to errors. Some are hard errors, for example, because a certain element of a circuit becomes incapable of assuming more than one of the two (or more) information-dependent signal levels. Other errors are present only temporarily, for example, as a result of external interference signals. The invention concerns itself with both types of error.

In the above-mentioned system the second data inputs and the second data outputs may in fact be physically the same pair of terminals which are then bi-directional. This may also be the case for the first data input and the first data output. A system as described above, with n=3, is suitable for the comparison of three parallel bits present in the closed path and for the reconstruction of the correct information value on the basis of a majority decision. For complete certainty, all elements (processor elements, memory capacity, information-reconstructing elements and data paths) must all be present at least in three-fold. The information-reconstruction device can be single but then no correction is possible for errors that arise in the information-reconstruction device itself. If the reconstruction device is also present in three-fold, extra connections are necessary so that all information is fed to each of the information-reconstruction devices.

Some properties of error-correcting and error-detecting codes will first be discussed. It will be found that a processor element, together with a corresponding section of the memory and a separate reconstruction part of the information-reconstruction device is contained in a separate error-isolation area. In a symmetrical case, for example, (all working on the same bit length), each of the isolation areas yields b bits; in a version to be discussed later b has the value 4. Such a group of b bits is called a "symbol"; the significance of this term will be further explained later. Suppose now that the information content of the output signals generated together by all error-isolation areas can be represented by k symbols each of b bits. The actual quantity of signals is n symbols of b bits. The code is said to be systematic at bit level if each of the b×k information bits can be reconstructed from precisely one of the b×n code bits; b.(n−k) bits are thus redundant. The code is said to be systematic at symbol level if each of the k information symbols, which together contain the whole information content, can be reconstructed from precisely one code symbol; (n−k) symbols are then redundant. Non-systematic codes are also possible but the coding/decoding devices are then often more complicated.

A "distance" quantity may now be defined, which is a property of the code. According to Hamming, the distance is the minimum value of the smallest difference, in number of bits, between any arbitrary pair of code-words. The code is now defined as having a "distance" of D over the symbols; D is the minimum value of the smallest difference in number of symbols between any arbitrary pair of code-words. In a multiple bit symbol the value of this difference can be different (provided it is not equal to zero). There are various ways of detecting and correcting erroneous code-words. If D is odd and greater than unity, then $t=(D-1)/2$ erroneous symbols can be corrected if the correction facilities are used to the full. (If D=1, detection/correction of an erroneous symbol is not certain. If D is even, D/2 erroneous symbols can always be detected of which $t=(D-2)/2$ can be corrected. It is possible that the correction facilities are not used to full capacity, because the correction facility may be activated to perform only a more restricted correction than that which is theoretically possible, for example only $t<(D-1)/2$ for D odd or only $t<(D-2)/2$ for D even. In this case there are in total (D−t−1) symbol errors to be detected of which t can be corrected. In extreme cases t may even assume the value zero. For example, for D=6 it is possible either to make 3 errors detectable, 2 of which can be corrected, or 4 errors detectable of which one can be corrected, or 5 errors detectable of which none can be corrected. The omission or restriction of the correction facility can be advantageous where the correction operation causes a delay or where, in certain cases, it is desired to have the greatest possible certainty that no erroneous code word is passed through as correct.

SUMMARY OF THE INVENTION

The invention is based on the realization that it is possible to reduce the redundancy in certain parts of a system by an extra investment in other parts of the system and, in particular, to process a larger quantity of information in these parts. It is thereby an object of the invention to realize a less expensive computer system by a reduced requirement in memory capacity, against which only a limited increase in processor capacity is needed.

According to the present invention there is provided a multi-processor computer system comprising a plurality of n, where n≧4 error-isolation areas, each isolation area including a parallel operating processor having an input and an output which is coupled to a memory section for storing temporarily the information derived from the processor output, an output of the memory section is coupled to the input of the processor thereby to form a retrocoupled path for the information, an information reconstruction section in each retrocoupled path, each information reconstruction section having n inputs for receiving all the information circulating in all the retrocoupled paths of the n error-isolation areas, and an encoder coupled between the processor output and the memory section, the encoder on the basis of a data-word generated by the processor and constructed of k symbols, each of b bits forming a code-symbol of b bits for storage in the corresponding memory section, as part of a code-word consisting of n code-symbols belonging to a set of code-words with a code-distance, defined over the symbols thereof, having a value of D ($D \geq 3$), where the relation between D, k and n is given by:

$$D.k - (D-1) > n - (D-1) \geq k \geq 2.$$

In the system in accordance with the present invention the information-reconstruction device becomes more complex than in the prior art, but the reduced memory capacity makes the system less expensive. The saving in costs is obtained because a code-symbol shorter than the corresponding data word is formed in each encoder. In each error isolation area (see below), therefore, a data reduction takes place in two stages: first in the information reconstruction section from code-word to data word and then in the encoder from data-word to code-symbol.

The relation between D, k and n is derived as follows from a number of restrictions, viz.

$k \geq 2$, because for $k = 1$, we get the n-fold system which, as stated, has the drawback of being expensive.

$n < Dk$, because $n = Dk$ leads to k parallel n-fold systems as above, with the same drawbacks.

$n \geq k + D - 1$: this is a requirement from the theory of error-correcting codes.

For the theory of error-correcting codes in general, reference may be made to the book by W. W. Peterson et al. "Error-correcting codes", MIT Boston, 2nd printing, 1971, which is the standard work in this field. This book gives a large number of codes and shows how they may be generated (mathematically). It should be understood that the present invention is not concerned with the code itself but with a multi-processor computer system in which use is made in a special way of the advantageous properties of such codes. Apart from the above relations, there is also a lower limit imposed on the value of b, this limit depending on the specific properties of the particular code used.

Advantageously, the value of n is given by $n = k + D - 1$ where, for $D = 4$, $b \geq \log_2(n-2)$, but otherwise $b \geq \log_2(n-1)$. It has been found that use of just this code family (MDS = minimum distance between symbols) makes possible a multi-processor computer system having wide facilities for the detection/correction of errors with only a limited number of necessary elements.

Advantageously, the values of D, b and k are given by the following relations:

$D = 3$, $n = k + 2$, $b \geq \log_2(n-1)$. This yields a relatively low amount of required redundancy, viz. $n/(n-2)$ times for the memory and n times for the processor elements. Yet one erroneous code symbol per code-word can each time be corrected or two erroneous code-symbols per code-word can be detected (without correction).

Advantageously, the values of b, k and n are given by: $n = 4$, $k = 2$, $b \geq 2$. This means that the processing capacity here is four times that of a single-processor but that the memory only needs to have twice the capacity of a uni-processor system. For a three-fold multi-processor with bit-wise majority decision, the costs are considerably higher.

Advantageously, the encoders mentioned are suitable for transmitting the (n = 2) data-symbols mentioned without further coding as elements in the code-symbols mentioned. This gives a simplification because the logical construction of the encoders is partly reduced to a selection of the data-bits. The data-symbols are preferably taken over directly as code-symbols.

Each error-isolation area may have a register for one code-word at the input to the information reconstruction sector. The operation of the elements in the various error-isolation areas is mutually synchronous. Some inequality of phase is however permissible. The purpose of the input register is to ensure that the input information (the code-word may or may not be erroneous) no longer changes at the moment that the information reconstruction sector begins with the reconstruction of the data-word. This is necessary because for example otherwise a combinatorial network therefore would receive a changing signal and that would give rise to an indeterminate output signal.

At least one of the information reconstruction sections may be provided with a signal output for indicating the detection of a correctable or non-correctable error. If the error is such that reconstruction is impossible, the error detection signal can be used to start a "repeat" operation. If reconstruction is possible, the detection signal can be used to up-date a file giving the degree of unreliability of the various error-isolation areas. In the event of an error that cannot be corrected, the most unreliable isolation area may be ignored.

Advantageously, for the connection of a peripheral apparatus, in a first error-isolation area, the processor element is provided with at least one outgoing control line and with an output line for a data word for the peripheral apparatus concerned, and that further in all error-isolation areas the respective processor element is provided with at least one incoming control line and an incoming line for a data word from that peripheral equipment and that, further, all the incoming lines mentioned are provided with switches that can be activated in a blocking way by an output signal from the corresponding processor element. Peripheral equipment can be of various types: input/output devices such as keyboards, displays or printers, background memories such as magnetic disk memories with corresponding control circuits and finally, it may be a second computer system, for example, a subordinate or front-end processor. Especially in the case of simple peripheral equipment having little or no data-processing facilities, the last-mentioned system represents a simple and cheap solution. The operation of the peripheral equipment is not then included in the protection given by the redundancy mentioned earlier. In the event that the peripheral equipment transports data only in one direction, the data link will be non operational in the other direction. In a simple version the control lines concerned will be a request line in the outgoing direction and an acknowledge line in the incoming direction. In complicated situations there may be status lines, interrupt lines and other types of line. On the other hand, in a very simple situation, the peripheral equipment may be embodied in a call-organization (polling). For example, a sensor- + A/D converter may be concerned which, when called, transmits the value of some measured analog quantity in digital form. The ingoing control line for each error-isolation area is then not required.

For the connection of peripheral equipment, it is advantageous if this is provided with first means to receive the code-symbols from all error-isolation areas formed by the corresponding encoders of and on the basis thereof to reconstruct the corresponding data-word, that further in each error-isolation area the processor element is provided with at least one outgoing control line for that peripheral equipment and a second encoder and that the peripheral equipment mentioned is provided with second means to form from the decoded control signals from each error isolation area a control word on the basis of the same symbol-correcting code as that used for the code-word, and that further in each error isolation area the processing element concerned is provided with at least one incoming control line and with an incoming line for a data-word from that peripheral equipment and that further all the incoming lines mentioned are provided with switches that can be activated in a blocking manner by an output signal from the corresponding processor element. This yields an improved protection because now the transport of information signals and control signals from the respective error-isolation areas to the peripheral equipment is also protected by a redundancy code. For this purpose, only a limited number of measures are necessary in the peripheral equipment. As stated above, the incoming control lines from the various error-isolation areas are now, in certain cases, not necessary. With regard to the outgoing control lines of the various error-isolation areas, it is assumed that, owing to the encoding, fewer connection lines are necessary than when all control signals were to be transmitted directly. If there is no reduction in the number of lines, it is more advantageous to transmit the control signals in uncoded form, after which each time a majority decision is taken in the peripheral equipment. For example, in the case of only a single outgoing control signal per processor element, a single error correction facility (here a symbol $\equiv$ a bit) can be obtained for $n=4$ by connecting only three control lines and leaving the fourth unconnected.

For the connection of peripheral equipment, advantageously this is provided with first means to receive from all error-isolation areas the code-symbols formed by the corresponding encoder and on the basis of that received to reconstruct the corresponding data-word, and further with third means to form a code-word from a data-word that has been formed by means of encoding as in the error-isolation areas, that further in each error-isolation area the processor element is provided with at least one outgoing control line for that peripheral equipment and a second encoder and that the peripheral equipment mentioned is provided with second means to form a control word from the control signals so encoded in each error-isolation area, on the basis of the same symbol-correcting code as used for the code-word, that further in each error-isolation area the processor element concerned is provided with at least one incoming control line from that peripheral equipment and the information reconstruction section is so connected by way of a switching device to be driven in a blocking way by an output signal from the processor element in question, that it can receive a whole code-word generated in the peripheral equipment mentioned. In this way also the information transport in both directions between the various error-isolation areas and the peripheral equipment is protected by a redundant code. Here the same possibilities for hardware exist as described in the preceding paragraph.

For the connection of peripheral equipment that is distributed over second error-isolation areas, advantageously each second error-isolation area is provided with first means to receive the code-symbols formed by the corresponding encoder from all first error-isolation areas and on the basis of that received to reconstruct each corresponding data-word and further with fourth means to form a code-symbol from a data-word produced by way of encoding each time as in a corresponding first error-isolation area. Further, the processor element in each first error-isolation area is provided with at least one outgoing control line for the peripheral equipment and a second encoder and the peripheral equipment mentioned is provided in each second error-isolation area with second means to form a control word from the coded control signals from each first error-isolation area, on the basis of a symbol-correcting code. Further all first error-isolating areas are provided with fifth means to receive from all second error-isolation areas at least one control signal and therefrom to form a corresponding combined control signal and to feed this, via a switching device which can be activated in a blocking manner by an output signal from the corresponding processor element to this processor element. In all first error-isolation areas the information reconstruction sector is connected via a further switching device which can be activated in a blocking manner by a second output signal from the corresponding processor element, to receive a whole code-word generated in the peripheral equipment mentioned. In this way the transport of control signals in both directions between the various first error-isolation areas and the corresponding second error-isolating areas is also protected by a redundant code.

It is favorable if the peripheral equipment mentioned has n second error-isolation areas. This makes for a balanced and symmetrical structure.

In order to facilitate the understanding of the following description, firstly an example will be given of a code to be used, whereby a code-word is built up of four parts; next some preferred versions of devices working on the basis of this code system are given, and finally a number of possibilities are formulated for the extension of the code.

BRIEF DESCRIPTION OF THE DRAWINGS

The present invention will now be explained and described, by way of example, with reference to the accompanying drawings, wherein.

DESCRIPTION OF THE PREFERRED EMBODIMENTS

Figure 1:
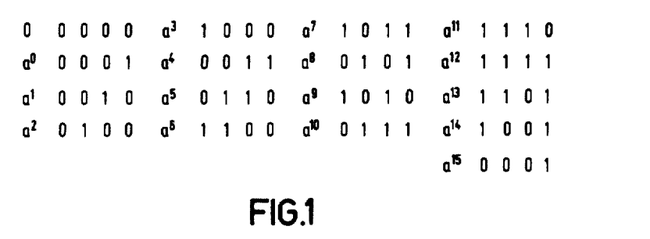
FIG. 1 shows the sixteen elements of the Galois field GF ($2^4$)

For a proper understanding of the invention the concept "symbol" will now be defined. A symbol is a bit group consisting of a fixed number of bits, for example M. The symbol can thus have $2^M$ different values and can be regarded as an element of a Galois field, denoted in this case by GF($2^M$). For the $2^M$ elements of a Galois field there are four algebraic operations defined (adding, subtracting, multiplying and dividing). These are described in an article by T. C. Bartee and D. I. Schneider "Computation with finite fields" in Information and Control, Vol. 6 (1963), pp. 79–98. The result of such an operation is again an element of the same Galois field. In this connection, FIG. 1 shows the sixteen elements of the Galois field $GF(2^4)$ once as a power series and once as a bit group. In themselves, these representations are conventional. The bit groups can be formed by using the so-called primitive and irreducible polynominal $x^4 + x + 1$. The quantities $a^0$, $a^1$, $a^2$, $a^3$ are in this example linearly independent of each other. The value of M is, in principle, arbitrary. The element 0 (bit-wise 0000) and $a^0$ (0001) are for brevity to be written from now on as 0 and 1 however it should be remembered that they represent symbols).

In the first example the computer system works on the basis of data-words of 8-bits. These words can be regarded as being built up of two data-symbols, each of four bits. The data-words are encoded in (longer) code-words of sixteen bits which are always organized as four code-symbols each of four bits. This may be formulated as follows:

$$\vec{c} = (c_3, c_2, c_1, c_0); c_i = (c_{i3}, c_{i2}, c_{i1}, c_{i0}).$$

where c is the code-word, which is in fact an element of $GF(2^{16})$. Further, each code symbol $c_i$ is an element of $GF(2^4)$ and each $c_{ij}$ is an element of $GF(2)$. In $GF(2)$ the elemetns can only have the values 0 and 1. Each code-word $\vec{c}$ must satisfy the condition that it is orthogonal to the parity check matrix [H] of the code in question:

$$[H] \cdot \vec{c} = 0.$$

A suitable code is known from the book "The theory of error-correcting codes" by F. J. Mac-Williams and N. J. A. Sloane, North Holland Publ. Co., viz. Chapter 11. For this we have, for example:

$$[H] = \begin{bmatrix} a^0 & o & a^0 & a^0 \\ o & a^0 & a^0 & a^1 \end{bmatrix}$$

Each row consists of as many symbols as the code-word possesses code-symbols. Under certain conditions, a code-word can be corrected by this code, if it contains at most one erroneous code-symbol (erroneous in arbitrary fashion). A code-word of four symbols, each of four bits, satisfies these conditions. Such an erroneous code-word can be denoted as $$\vec{c}^* = \vec{c} + \vec{e}$$

where $\vec{e}$ is an error word consisting of one error symbol and further three symbols identically equal to zero. Multiplication of the erroneous code-word $\vec{c}^*$ by the parity check matrix [H] gives:

$$[H] \cdot \vec{c}^* = [H] \cdot (c+e) = [H] \cdot c + [H] \cdot e = s$$

If at most one of the four symbols of the error word $\vec{e}$ contains a non-zero error, we have the following relation between the error word $\vec{e}$ comprising four symbols and the vector $\vec{s}$ comprising only two symbols:

| $\vec{e}$ | | | | $\vec{s}$ | | $\vec{e}$ | | | | $\vec{s}$ | |
|---|---|---|---|---|---|---|---|---|---|---|---|
| o | o | o | o | o | o | o | e | o | o | o | e |
| o | o | o | e | e | $a^1 \cdot e$ | e | o | o | o | e | o |
| o | o | e | o | e | e |

From the information content of the vector $\vec{s}$, the error locator, which indicates which code-symbol is erroneous, can be derived easily and unambiguously: if both symbols of the vector $\vec{s}$ have the value o there is no error. If only the first symbol of the vector $\vec{s}$ has the value o, only the second code symbol is erroneous. If only the second symbol of the vector $\vec{s}$ has the value o, then only the first code symbol is erroneous. If both symbols of the vector $\vec{s}$ have the same non-zero value, the third code symbol is erroneous. If neither symbol of the vector $\vec{s}$ is equal to zero, it may be that only the fourth symbol is erroneous. In that case a check is necessary to see if these two symbols are related as e: $(a^1 \cdot e)$. In the case described this check is simple:

$$a^1 \cdot e = a^1 \cdot (e_3 \cdot a^3 + e_2 \cdot ]a^2 + e_1 \cdot a^1 + e_0 \cdot a^0)$$

$$= e_3 \cdot a^4 + e_2 \cdot a^3 + e_1 \cdot a^2 + e_0 \cdot a$$

$$\begin{pmatrix} 0100 \\ 0010 \\ 1001 \\ 1000 \end{pmatrix} \cdot \begin{pmatrix} e_3 \\ e_2 \\ e_1 \\ e_0 \end{pmatrix} = \{e_2, e_1, (e_3 + e_0), e_3\}.$$

The columns of the left-hand matrix form the binary representations of $a^4$, $a^3$, $a^2$ and $a^1$, respectively. If one of the five cases described occurs, the "error value" (as opposed to the "error locator" mentioned above) is given by the first symbol of the vector $\vec{s}$, unless this symbol has the value o (which implies that the second code symbol is erroneous).

If neither symbol of the vector $\vec{s}$ has the value o, and they are not related as $1:a^1$, then an error is present that cannot be corrected. If, on the other hand, the vector $\vec{s}$ indicates one of the four possibilities mentioned for the indication of a one-symbol error, this may also be caused by a multi-symbol error. The latter will then be corrected incorrectly and the result will be incorrectly indicated as correct. Some multi-symbol errors that would lead to incorrect corrections are, for example:

(e e o o): gives a correction in the third symbol.
(e o, e o): gives a correction in the second symbol, because addition modulo 2 is always used.

The redundancy bits are generated by the generator matrix [G], which is related to the parity check matrix [H] is known way by:

$$[H] \cdot [G] = 0; [G] = \begin{bmatrix} a^0 & a^0 \\ a^0 & a^1 \\ a^0 & o \\ o & a^0 \end{bmatrix}$$

The code-word c is found from $\vec{c} = [G] \cdot \vec{a}$, where $\vec{a} = (a_1 \, a_o)$ is the information vector or the information (data) word of eight bits. A choice can now be made between two possibilities:

(a) The code-word comprises four symbols, each of two bits.

(b) The code-word is split into two partial code-words each of four symbols (two data symbols and two redundancy symbols).

Note. The minimum number of bits per symbol is 2. If there were 1 bit per symbol a partial code-word occurs of four bits with two redundancy bits; the number of redundancy bits is then too small for a correct correction. In general for n code symbols in a code-word and for (n−2) data symbols in the data word, the number of bits per code symbol must be at least equal to the smallest integer that is not less than $\log_2(n-1)$ in order to be able to correct an arbitrarily erroneous code symbol. For n=6, each code symbol would the contain at least three bits (in practice four bits would normally be taken). Similar reasoning is valid if more than one erroneous code symbol per code-word has to be corrected.

In the foregoing the second possibility (b) would often yield the simpler system and this is therefore considered further below. The matrices [G] and [H] retain their form, with the symbols otherwise denoted: o is (00), $a^o$ is (01), $a^1$ is (10). The sixteen-bit code-word $$\vec{c} = c_{33}c_{32}c_{31}c_{30}c_{23}c_{22}c_{21}c_{20}c_{13}c_{12}c_{11}c_{10}c_{03}c_{02}c_{01}c_{00}$$

is now split into two eigth-bit partial code-words: the first partial code-word contains the first, second, fifth, sixth, nineth, tenth, thirteenth and fourteenth bits; the second partial code-word contains the eight other bits. We can then write:

$$\vec{c} = c_{31}c_{30}c_{21}c_{20}c_{11}c_{10}c_{01}c_{00}$$

$$\vec{a} = a_{11}a_{10}a_{01}a_{00}$$

Figure 2A:
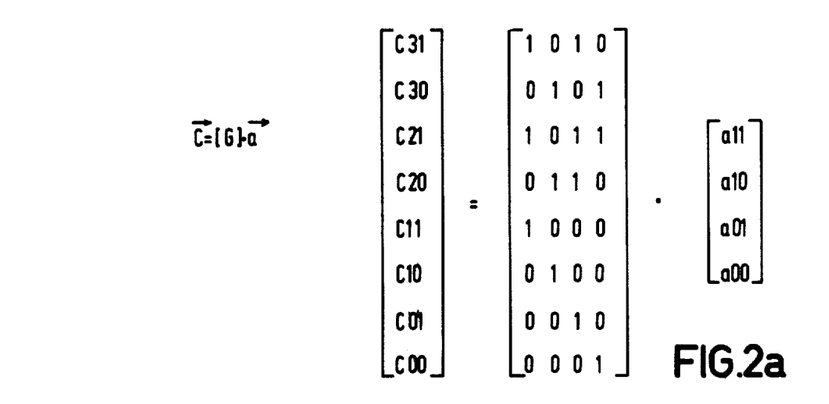
FIGS. 2a, 2b and 2c give examples of the formation of code symbols.
Figure 2B:
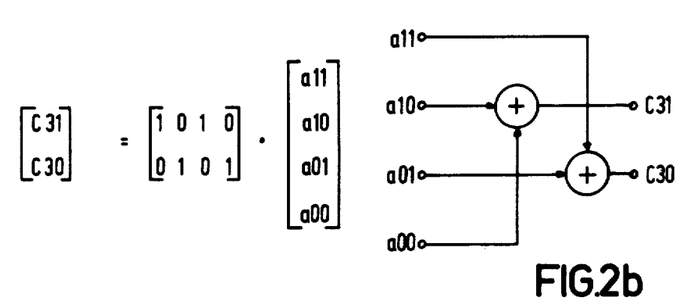
Figure 2C:
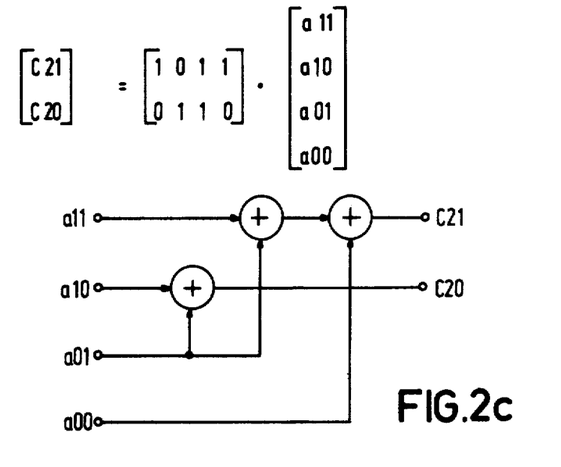

FIG. 2a gives the generator formulae $\vec{c}=[G]\cdot\vec{a}$ in matrix form. FIG. 2b shows the formation of the first two-bit code symbol and FIG. 2c the formation of the second two-bit code-symbol, both in matrix form and showing the realization by means of logical EXCLUSIVE-OR gates or modulo-2 adders. The latter are represented by a circle containing a cross. Synchronization and other control signals are not indicated in FIGS. 2b and 2c, for simplicity. The generation of the other two code-symbols in this systematic code are simply given by:

$(a11a10a01a00)=(c11c10c01c00)$

The data symbols involved are thus unchanged as parts of the code-word. The sequence of the code-symbols within the code-word can of course be different. A decoder to reconstruct the data word from the corresponding code-word will be discussed later.

Figure 3:
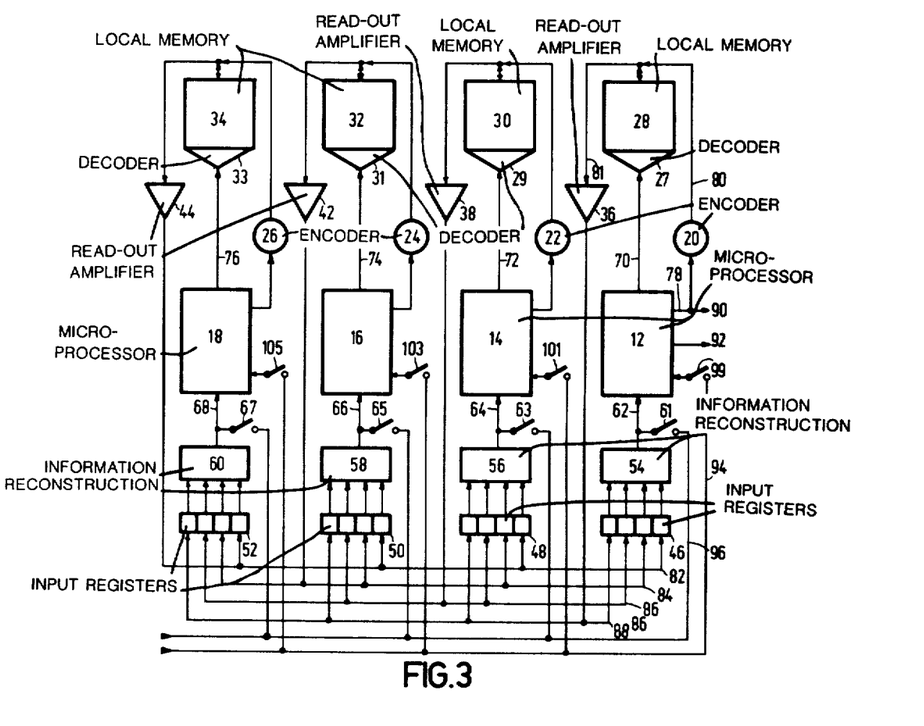
FIG. 3 illustrates an example of a simple computer system in accordance with the invention.

FIG. 3 shows a simple version of a computer system in accordance with the invention, on the basis of the information being organized in bit groups (bytes) of eight bits. These are assumed to possess no rendundancy; if this information were processed in parallel in a uni-processor system, all data routes would have a width of 8 bits and the local memory of the processor would also have a word length of 8 bits. The arrangement of FIG. 3 is a four-fold system in which each byte of information is represented in each processor by eight information bits and in the local memory sector of each processor (processor element) by four code bits. If the memory is expensive compared to the processors, this implies that this system is twice as expensive as the uni-processor system. The system will now be discussed without reference to peripheral equipment, that is to say, without implementation of lines 90, 92, 94, 96. Furthermore, the extreme right-hand side of the figure comprising the elements 12, 28, 46 and 54 will be discussed.

However before describing FIG. 3, reference will be made to FIG. 4 which shows a suitable microprocessor for use as a processor element 12 in FIG. 3. This element is described in the book "Signetics 2650 microprocessor" published by the manufacturer, Signetics Corporation, 811 East Arques Ave., Sunnyvale, Cal. USA 1975, notably in FIG. 1 thereof. The numbers within circles represent the 8-bit data paths and the 13/15 bit address paths. The connections marked "1" or "x" are part of the control bus. For simplicity, the remaining lines of this control bus are not shown. Line 200 is a bi-directional data bus with attached register 202. The incoming line 204 is connected to the 8-bit instruction register 206, the 8-bit hold register 208, an 8-bit input to the address adder 210 (this works over a width of 13 bits) and to a data connection of the arithmetic and logic unit (ALU) 240 (working over a width of 8 bits). An interrupt-request signal from outside can appear on line 214. Line 216 is reserved for an interrupt-acknowledge signal. Furthermore, the microprocessor concerned has a connection (not shown here) for the reception of a pause signal which causes it to stop at the end of the current instruction. This pause signal can terminate the processing of data for an indefinite time; it is used to realize direct memory access (DMA). In connection with lines 214 and 216, the interrupt logic is contained in block 212. This block can also send a signal to the interrupt and control logic in block 218. Lines 220 are the input/output control lines. The signals on these lines cooperate with the logic block 222 and also block 218. Line 224 is an external clock-pulse line; these clock-pulses are processed in the time-generating logic 226 to secondary clock pulses for block 218. For simplicity the outgoing control lines from block 218 to the further elements of the circuit are not shown. A second thirteen-bit wide input of the address adder 210 is connected to the address bus 228, the external connections of which are only suitable for the transmission of signals. Element 230 is the operand address register, element 232 is the instruction address register, element 234 is the address output control element, element 236 is the sub-routine return address stack and element 238 the stack pointer. The internal control is done by signals from block 218 and by the contents of the program status word in element 242. There is in addition a register stack which contains the zero register 246 and 2×3 registers in the further stack element 248. Element 250 is a multiplexer. Block 252 contains logic for the condition code and for possible branches. For the functions realizable by this microprocessor and for other technical details reference should be made to the manufacturer's book cited above.

Figure 4:
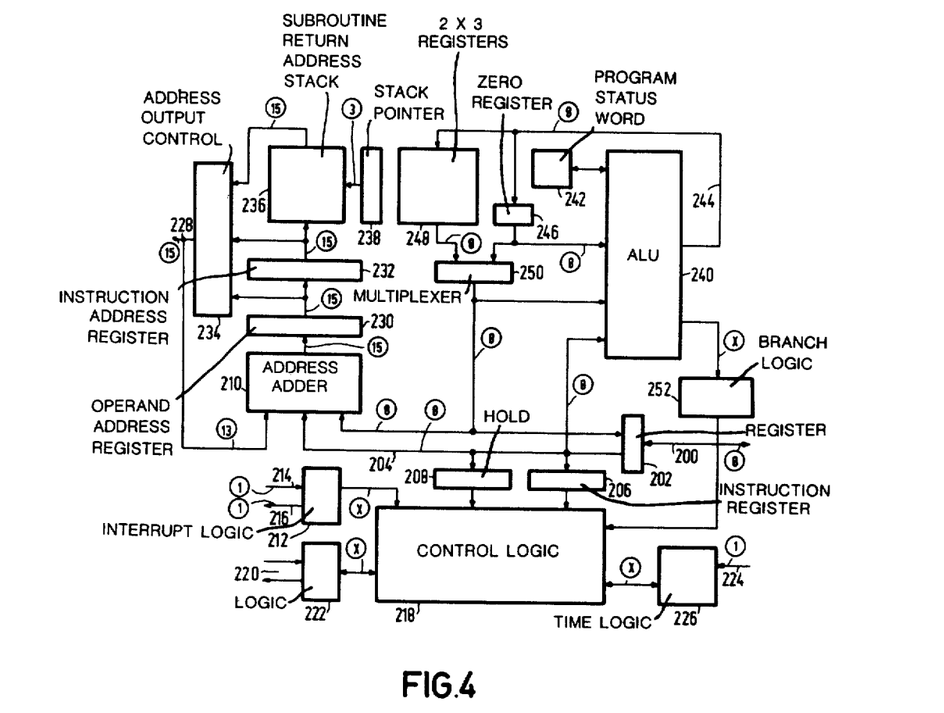
FIG. 4 shows a microprocessor that can be used as processor element in an error-isolation area, FIG. 5 gives an example of an information reconstruction section, FIGS. 6a and 6b together show a multi-processor computer system and peripheral equipment, the latter being divided into various error-isolation regions.

Referring now to FIG. 3 an 8-bit data word appears on line 62 (corresponding to line 200 in FIG. 4). This is processed in processor element 12, the nature of the operations depending on the purpose for which the computer system is used. It can thus involve the up-dating of a data file or the execution of some complex scientific calculation, or, for example, the processing of parameters to generate one or more control quantities in an industrial control system. The microprocessor 12 produces an output data-word on line 78 (line 299 in FIG. 4) and an address word on line 70 (line 228 in FIG. 4) to address the local memory 28 by means of the addressing device 27 (containing, for example, a decoder). In the encoder 20 a four-bit code symbol is formed from the 8-bit data-word received, and is presented to the memory 28 where it is stored. The information read-out from the memory 28 appears as a code symbol on line 81 and is regenerated in the read-out amplifier(s) 36 which possess an adequate margin of fan-out. In this way the code symbol is presented on line 88. This can also be done without intermediate storage in memory 28. When the above-mentioned Signetics 2650 microprocessor is used, the lines 78 and 62 are thus interconnected. When no peripheral equipment is connected, the information reconstruction sector 54 acts, with respect to this microprocessor, as the only information source and the encoder 20 acts as the only information destination. The system described above is present in four-fold (processor elements 12, 14, 16, 18 and, memory sections 28, 30, 32, 34 with the corresponding circuits) and except for the encoders 20, 22, 24, 26 (see later), all these systems are identical. Moreover, the processor elements 12, 14, 16, 18 all operate according to the same program and they hence carry out the same operations together. The instructions of this program can also be encoded to code-words which are stored in the memory sections 28, 30, 32, 34. Another possibility is that the instructions are stored separately in each error-isolation area. The synchronization of the operation of the four error-isolation areas is not shown. The various means of synchronization are described in an article by D. Davies et al. "Synchronization and matching in redundant systems", IEEE Trans. Comp. Vol. C.27 (June 1978), pp. 531–539.

If the input information on lines 62, 64, 66, 68 is identical, all encoders 20, 22, 24, 26 always receive the same information. From this information each of them forms two two-bit code-symbols according to the principles discussed in connection with FIGS. 2a, 2b and 2c. In particular, in a simple version two code-words, each of four symbols of two bits, are formed from the data-word of 8 bits. For example encoder 20 contains a circuit to allow the first two bits of the data-word to pass through for the first code-word and a circuit as in FIG. 2b to form a redundant code-symbol for the second code-word. Encoder 22 contains a circuit to allow the second two bits of the data-word to pass through for the first code-word and a circuit as in FIG. 2c for the second code-word. Encoder 24 contains a circuit to allow the third two bits of the data-word to pass through for the second code-word and a circuit as in FIG. 2b for the first code-word. Encoder 26 contains a circuit to allow the fourth two bits of the data-word to pass through for the second code-word and a circuit as in FIG. 2c for the first code-word. In fact, in this way each encoder only needs to receive six bits of the data word. Furthermore each processor element has its own information reconstruction section, blocks 54, 56, 58, 60, with their input registers 46, 48, 50, 52. These registers each receive all information (16 bits) read out together from the respective memories via the respective connections 82, 84, 86, 88, for the data-word to be reconstructed in the information reconstructors. Each information reconstruction sector contains, for example a read only memory (ROM) with $2^8$ addresses each with a word length of four bits. For each data-word to be reconstructed, a four-bit address is read-out twice. Of the 256 addresses $2^4 = 16$ are addressable by a non-erroneous code-word with non-erroneous redundancy bits because this word is always formed on the basis of only four data bits. Each code-word may possess one erroneous code-symbol of two bits, i.e. there are 4×3 possibilities for a correctly corrigible word because the error (the error symbol) may have three values. The above thus yields 16+192=208 possibilities that give a correct correction. The remaining 48 possibilities involve a double or multiple error. In that case the ROM may deliver an error indication if one of the memory locations concerned is addressed. Alternatively, in the event of an error occurring in one of the error-isolation areas it is also possible to produce the error-locator. In this case that would imply that an 8-bit (half) code-word would be received. This produces a four-bit data-word, one bit to indicate that one symbol error has been detected, two bits to give the corresponding error-locator and one bit to indicate that an incorrigible error has been detected. The corrected errors can be collected in a histogram that shows how often a given error-isolation areas has given an error. Under the control of the signal from an incorrigible error, the following further attempts at correction are possible, e.g.

(a) On the basis of the statistical distribution of the detected (and corrected) errors, a given error-isolation area can be declared to be "defective". Attempts are then made to correct the error in the other isolation areas.

(b) If such an incorrigible error is detected and no statistical data are available, a predetermined part of the system is always declared to be "reliable", for example just that part that reproduces the information symbols unchanged as code symbols.

(c) The original initial information is called from a background memory and the processing is repeated. This is a time-consuming procedure.

The indication "double error" can be generated once or twice per data-word. These indications are combined by an OR gate in the known manner. This is not shown in the figure.

Figure 5:
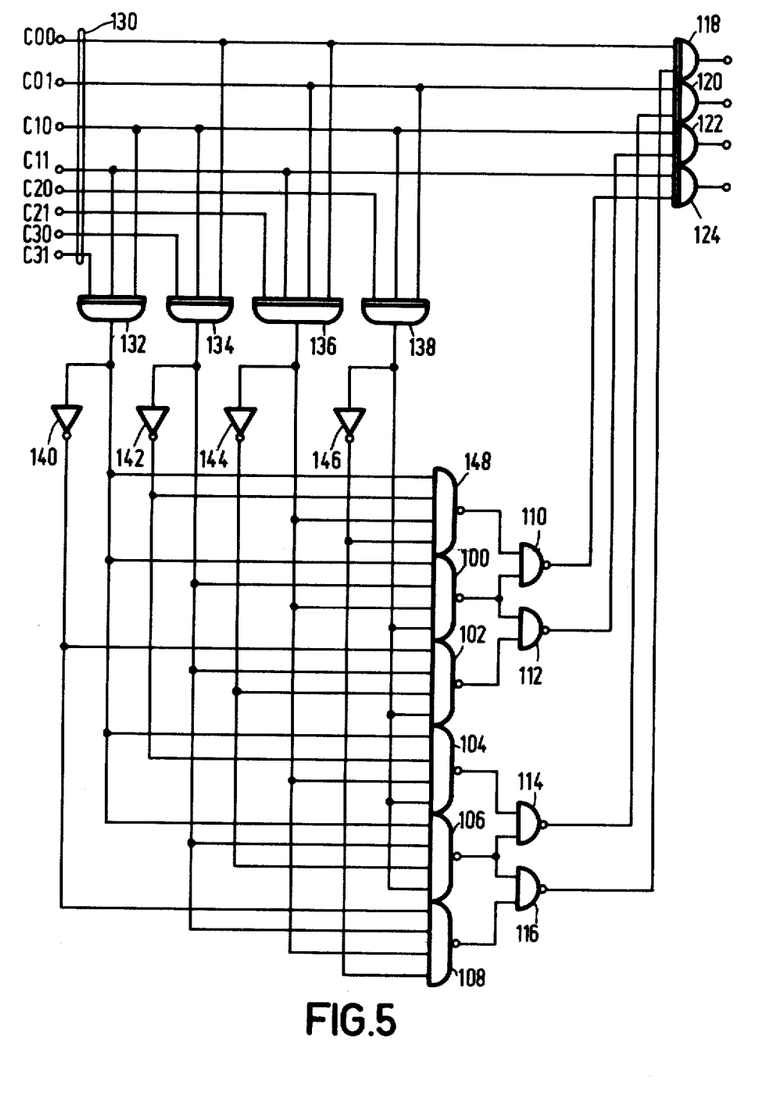

In contrast to information reconstruction on the basis of ROMs it is also possible for the information reconstruction sections to be built up from a combinatorial-logic circuit as shown in FIG. 5.

This circuit is present, 1× or 2×, for each of the building blocks 54, 56, 58, 60 shown in FIG. 3. Thre is an 8-bit input line 130 which receives two bits from each of the partial memories. The upper four lines carry the information bits, the lower four lines the redundancy bits. In the EXCLUSIVE-OR gates (modulo 2 adders) 132, 134, 136, 138, the redundancy bits are regenerated as in FIGS. 2b and 2c and compared with the current redundancy bits on the lower four input lines. If such a gate gives off a logical "0", this means that no error has occurred; these gates can themselves be known circuits according to U.S. Pat. No. 3,838,393. The error-indication bits formed in this way are fed via the inverters 140, 142, 144, 146 to the six AND gates 148, 100, 102, 104, 106, 108 and from there to the four NAND gates 110, 112, 114, 116. In this way, all the matrix multiplications discussed here above are formed in order to generate the corrector-symbol. This is added bit-wise (modulo 2) in the elements 118, 120, 122, 124, to the data information to correct possible errors. The outputs of the elements 118–124 are connected to a clocked data register from which the information is made available to be processed in the microprocessor, for example, the register 302 in FIG. 4.

In the foregoing, the elements 12, 20, 28, 36, 46, 54, (FIG. 3) formed parts of the same error-isolation area. The circuit of FIG. 3 contains four such areas each with similar circuits. Within each such area the errors occurring may be correlated. The errors occurring in different isolation areas are assumed to be independent of each other, as is the case in practice for many categories of error. The probability of errors in more than one area is then equal to the product of the probabilities in the separate areas; in general such a product has a very small value. The various areas are joined together by the lines 82, 84, 86, 88. The probability of errors occurring during the signal transmission in these lines can be made small by taking suitable measures (e.g. the amplifier 36). The errors within a single isolation area may thus have any value, even in the sense that the isolation area is completely inoperative. If the elements 12, 20, 28, 36, 46, 54 are all mounted on a single printed circuit board or in a single I.C. module, the whole board/module, may be then removed without the occurrence of a malfunction. This means that a service technician can remove the faulty elements while the system is working, often without disturbing the operation of the system.

The data routes shown in FIG. 3 have the following bit widths:

62 (64, 66, 68): 8 bits
80, 81, etc.: 4 bits
78: 8 bits (or possibly 6 bits if 2 bits are passed through directly and 4 further bits are coded to a two-bit code-symbol).

The memory sections 28, 30, 32, 34 are conventional building blocks and will not be discussed further.

FIG. 3 contains certain additions for the connection of peripheral equipment, for example an input/output device for data information. It is assumed that this device produces error-free information; this arrives, for example as 8-bit words, on line 96. This line can be connected via the interrupt switches 61, 63, 65, 67 to the information input lines 62, 64, 66, 68 of the processor elements 12, 14, 16, 18 respectively. Furthermore, there is a control line 94 from the peripheral equipment which is connected via the interrupt switches 99, 101, 103, 105 to the input/output control connections of the processors 12, 14, 16, 18, respectively. The information can be fed to the peripheral equipment via the 8-bit line 90, which is a branch of line 78. This line 78, at least, must be an 8-bit line and thus transmit more information than the minimum necessary for the encoder 20. A control signal is fed to the peripheral equipment via line 92 which comes from processor element 12. The peripheral equipment is not connected to lines coming from processor elements 14, 16, 18. The outputs concerned may well be present but they are not used. The lines 92, 94 can be used in the conventional manner to transport, in case of a data transmission, request and acknowledge signals, as for example described in the article by K. L. Thurber et al. "A systematic approach to the design of digital bussing structures", Proceedings AFIPS Conf. 1972, pp. 719–740, e.g. p. 727, right-hand column, FIG. 17 and the associated text. These control lines are formed in FIG. 4 by the lines 220 which run in both directions. The switches 61, 63, 65, 67 and 99, 101, 103, 105 are operated by a suitable signal from the processor element in question. If the processor element is a signetics 2650 microprocessor, this switch is implicit in the register 202. This register accepts information only under control of a signal from the processor itself. The switch 99 is then implicit in the interrupt logic in block 212 or in the input/output control logic in block 222, see FIG. 4. The switch 99 can be single or multiple as remarked earlier. In a polling organization it can even be left out entirely. When a more comprehensive processor element is used, the switches 61 and 99 may be in the form of physically separate building blocks.

In the foregoing the peripheral equipment in itself operates in the usual manner as is known in uniprocessor systems. For brevity, therefore, the peripheral equipment itself has not been shown further; it can be a conventional keyboard, display device or background memory, or it can be a sensor with an A/D converter or a subordinate computer. The reliability of the system can be limited by errors in the I/O unit or the data links thereto.

Figure 6A:
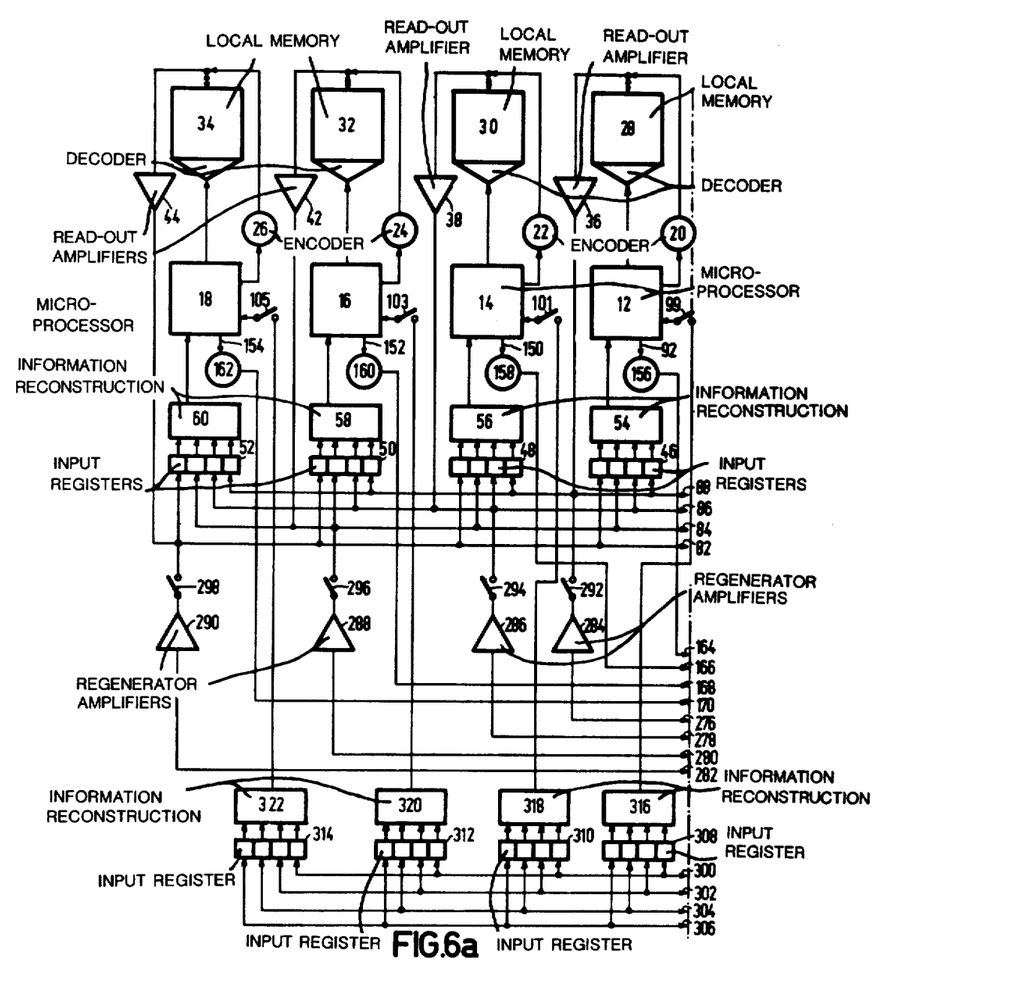
Figure 6B:
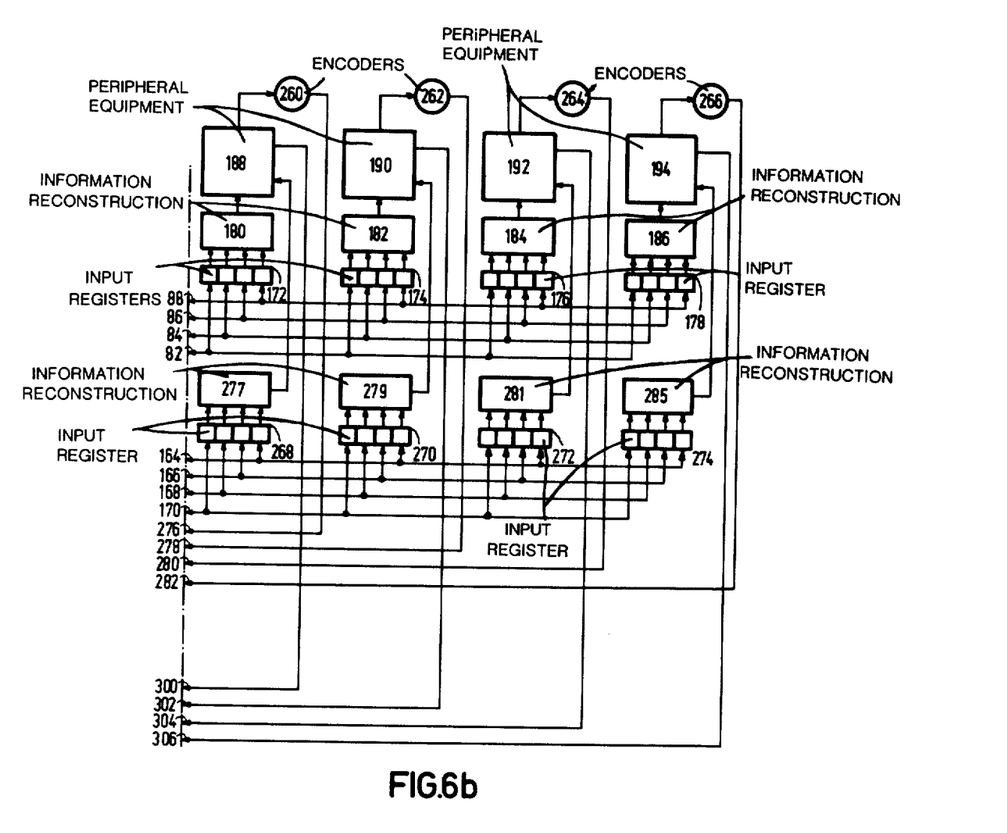

In this connection FIGS. 6a and 6b show a system in which the peripheral equipment and the data link are protected by redundancy. Not all the measures taken in FIGS. 6a and 6b need be implemented together and in the following the redundancy will be described as being implemented in stages. In the first instance, FIG. 6a—in particular the upper half—contains substantially the same elements as FIG. 3, again grouped in four error-isolation areas and numbered as in FIG. 3.

At a first level of redundancy, the data link with the peripheral equipment is provided with the same measure of redundancy as the rest of the system. The peripheral equipment system is shown in FIG. 6b and will be discussed as and when applicable. The additions to FIG. 6a are concerned with the following:

(1) The branch 90 (FIG. 3) of the data output line of processor element 12 is omitted and in its place all the data lines 82, 84, 86, 88 from the memory sections are connected through to the peripheral equipment.

(2) All the processor elements 12, 14, 16, 18 are provided with an outgoing line for control signals, viz. 92, 150, 152, 154 respectively, connected to encoders 156, 158, 160, 162, respectively. The two encoders e.g. 20 and 156 of one and the same error-isolation area may operate according to the same algorithm or according to different algorithms; this depends on the degree of reliability required. An incorrigible error may be found independently either with the control signals or with the information signals. Furthermore an absent control bit is supplemented by a fixed "0". If, for example, there are three outgoing control bits from the processor elements, these are encoded into an 8-bit control word. In the figure the four outgoing control lines 164, 166, 168, 170 all go through to the peripheral equipment. If there are only a few outgoing control bits, it is sometimes cheaper to transport these bits directly and to take a majority decision on the receiving side. For 2 control bits only 6 lines are then necessary. For 3 control bits only 6 lines are then necessary. For 3 control bits and more, the solution with encoders is, however, usually cheaper.

(3) Although not shown for the sake of brevity, the lines 94 (incoming control bits) and 96 (incoming data) (FIG. 3) are provided and are connected in the same way as in FIG. 3.

The measures in FIG. 6b are concerned with the following. In the first instance the peripheral equipment is only present in single-fold and represented by the block 188. Within that block no special provisions need to be made in connection with the implementation of the redundancy. Furthermore:

(a) All data lines 82, 84, 86, 88 are connected to an input register 172 of an information reconstructor section 180. This latter is constructed similarly to the elements 54, 56, 58, 60 of FIG. 3 to regenerate the data word.

(b) All lines for control signals 164, 166, 168, 170 are connected to an input register 268 of an information reconstruction section 277. This may be of similar construction to the elements 54, 56, 58, 60. In certain cases as has been explained earlier it can also be a majority-deciding circuit.

The elements in FIGS. 6a and 6b that have not been described can be left out of the arrangement because the measures of FIG. 3 are applied to them: notably in FIG. 6b the elements 190, 192, 194 and their associated components and the element 260 are absent. In FIG. 6a the elements 308-322 are also absent.

On the next higher level of redundancy, the data transport over the lines in both directions is protected by a redundancy code.

In the circuit of FIG. 6a the above-mentioned measures (1) and (2) are present without modification. Moreover the following applies:

(4) There are four incoming information lines 2176, 278, 280, 282, each of four bits. These are connected via the switches 292, 294, 296, 298 which may be activated in a blocking manner (as in FIG. 3 the switches 61, 63, 65, 67 are actuated by a signal from the relevant processor element) to the input registers of the information reconstruction sections 54, 56, 58, 60. In addition there are regenerator amplifiers 284, 286, 288, 290. Another possibility is that these regenerator amplifiers are left out and that the output of the switches 292, 294, 296, 298 are each connected to the input of the regenerator amplifiers 36, 38, 40, 44. The incoming data-word is then produced for further processing.

(5) The control line (94) is connected in the same way as in FIG. 3, for brevity not shown here. The measures (a) and (b) mentioned above are both present, unmodified, in FIG. 6b. There is also the following addition:

(c) The peripheral equipment block 188 is still present in single-fold. Its 8-bit wide output feeds the data-words to the encoder 260 and in parallel (thus not as shown in the figure) also to the encoders 262, 264, 266. These encoders are constructed similarly to the encoders 20, 22, 24, 26 (FIG. 3) and are connected to the outgoing data lines 276, 278, 280, 282, respectively. The inputs of the encoders 260-266 are thus combined to receive each time the same information word from the relevant peripheral equipment. Furthermore, the outgoing control signals are processed in the same way as FIG. 3, while the parts of FIG. 6a, 6b that have not yet been described can be left out because the measures of FIG. 3 have been applied to them.

On a next higher level of redundancy the information processing is also protected inside the peripheral equipment by a redundancy code. The above-mentioned measures (1), (2) and (4) are present unchanged in the circuit according to FIG. 6a. There is moreover the following addition:

(6) There are four incoming lines 300, 302, 304, 306, for control signals. In each error-isolation area (here 4), these lines are all connected to input registers 308, 310, 312, 314 of the corresponding reconstruction sections 316, 318, 320, 322, respectively. These are constructed like the elements 54, 56, 58, 60 (casu quo, however, also as majority circuits, in which case one of the lines 300, 302, 304, 306 can be left out). In this way the produced control signal can now be fed separately to the respective switches 99, 101, 103, 105, that may be activated in a blocking manner.

In the circuit of FIG. 6b the peripheral equipment is now itself present in four-fold. The synchronization between the four parts can be effected either by a master clock of the circuit according to FIG. 6a or by the mutual symchronization as mentioned for FIG. 3. Now the measures according to (a) and (b) are present in four-fold, so that there are twice four input registers (172, 174, 176, 178, 268, 270, 272, 274) and twice four reconstruction sectors for the data-word (180, 182, 184, 186) and for the control signals (277, 279, 281, 285), respectively. The actual information processing in the peripheral equipment takes place in blocks 188, 190, 192, 194, which themselves are conventional in nature and are not described further. The elements 172, 180, 188, 260, 268, 277 are in a single error-isolation area and the same is true for the other three-quarters of the circuit. Each peripheral equipment section has its own encoder 260, 262, 264, 266 to receive a data-word from the respective processing block 188, 190, 192, 194 and to generate a code-symbol. These code-symbol generators feed the lines 276, 278, 280, 282. In FIG. 6b it is further assumed that each error-isolation area generates at most two control bits to the circuit of FIG. 6a. For the illustrated embodiment no encoder then needs to be included in the output lines for the control bits 300, 302, 304, 306, however there may be cases where this is indeed necessary.

In certain cases the lines 82, 84, 86, 88 can be combined in pairs with lines 276, 278, 280, 282 to constitute a full-duplex or a half-duplex operating bus. In a similar way, a larger number of peripheral equipments can be connected. It is then possible, for example, to use a "star" configuration for the control lines and a "bus" configuration for the data lines. Moreover the level of the redundancy in processor (FIG. 6a) and peripheral equipment may differ; for example, the processor may work with D=3 (one erroneous symbol corrigible) and the peripheral equipment with D=2 (one erroneous symbol detectable). It is also possible that for D=3 in the peripheral equipment two erroneous symbols per code-word can be made detectable, the correction facility not being implemented.

POSSIBILITIES FOR EXTENDING THE CODE

In the foregoing the case of a data-word of 8 bits has been considered, which is converted into a code-word of four symbols, each of four bits or into two half code-words each of four symbols of two bits. In a similar way a data-word of 16 bits can be coded in three different ways, on the basis of symbols of 8, 4 or 2 bits. A large class of codes exists which can correct one symbol that is erroneous in an arbitrary fashion, in which a code-word contains n-2 information symbols and two redundancy symbols. The limitation is that the bit number (b) of a symbol be sufficiently large: $b \geq$ entier $\log_2 (n-1)$. In this way a 16-bit data-word can also be coded into six symbols, each of four bits, because $\log_2 (5)$ is less than four. Less memory space is then necessary (24 bits per data-word, instead of 32 bits previously). It could also be done with eight symbols of three bits, but that does not yield less memory space and it can only correct one symbol of 3 bits. An 8-bit data-word can, if required, be coded as 5 symbols of 3 bits. This is done in that first a pseudo data-word of 9 bits (the last is a dummy bit or, e.g. a parity bit) is created and that is then coded. The memory capacity required is 6% less than that according to FIG. 3, but the calculations are somewhat more complicated.

The method described above for the addition of redundancy is not restricted to protection against errors in only one error-isolation area. If a code-word contains more than two redundancy symbols, then more errors can be corrected. The MDS codes (minimum distance separable codes) used here have the property that the minimum distance between two symbols (Hamming distance) is equal to $(n-k+1)$, where $(n-k)$ is the number of redundancy symbols in a code-word.

For one redundancy symbol there is thus a distance of 2 and one erroneous symbol can be detected. The number of simultaneously corrigible errors is $(D-1)/2$, where D is the Hamming distance. For four redundancy symbols, two erroneous symbols can thus be corrected. A sixteen-bit code-word of eight symbols, each of two bits, can then be formed from an 8-bit data-word. Two partial systems may then become defective.

A number of specific possibilities for the codes to be used will now be given.

(1)
  n = 8 (eight error-isolation areas)
  k = 4 (four data-symbols)
  D = 5 (two arbitrarily erroneous code signals can be corrected)
  $b \geq \log_2(n-1)$, i.e. $b \geq 3$.
  We choose b = 4

Figure 7A:
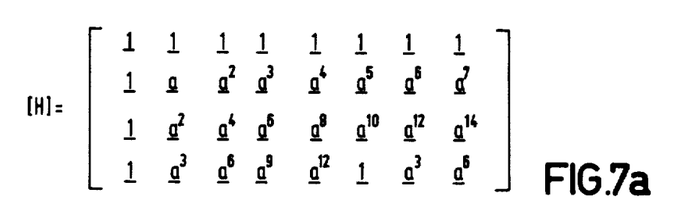
FIGS. 7a to 7e shows a number of further codes.

The data-word contains 4 symbols, each of 4 bits. The code-word contains 8 symbols, each of 4 bits. The code is, for example, defined by the matrix [H] shown in FIG. 7a, where a is an element of $GF(2^4)$.

(2)
The following code is not restricted by the requirements for an MDS system.

n = 12 k = 7 b = 1

The processor is twelve-fold; the redundancy in the memory involves a factor 1½.

Figure 7B:
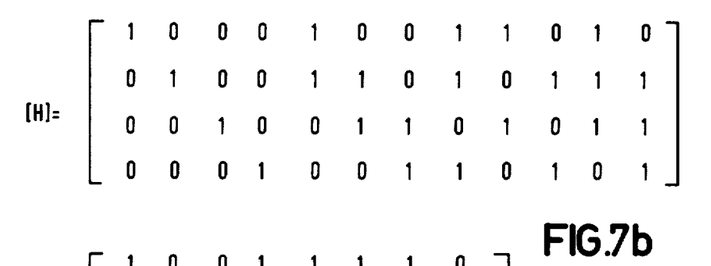
Figure 7C:
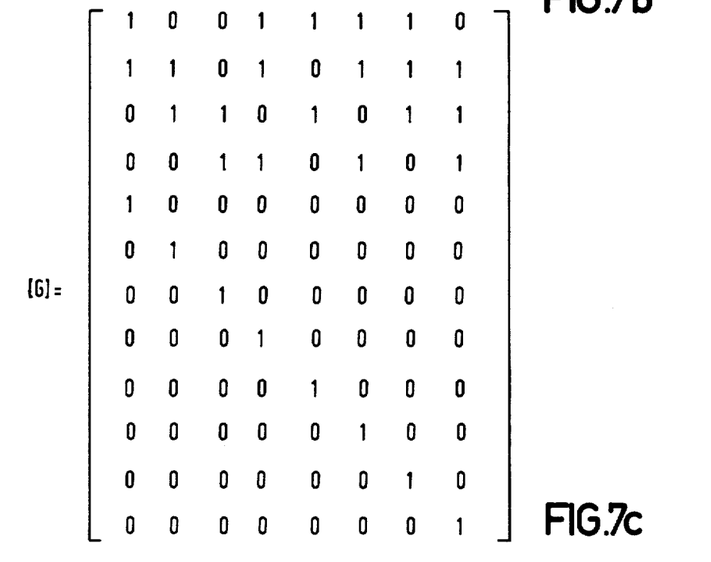

The code can correct one arbitrarily erroneous symbol of 1 bit. The code is defined, for example, by the parity matrix [H] shown in FIG. 7b and the generator matrix [G] in FIG. 7c.

(3) The following is again an MDS code.
  D = 4
  n = 5
  k = 2
  b = 2

Figure 7D:
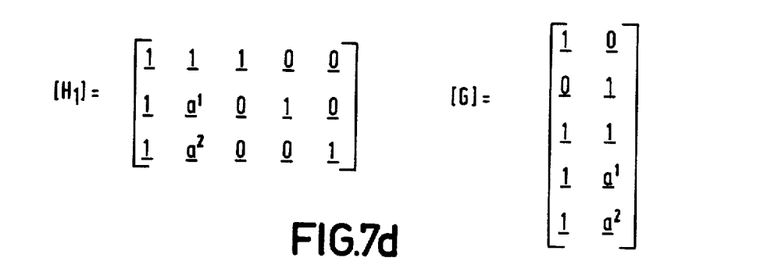
Figure 7E:
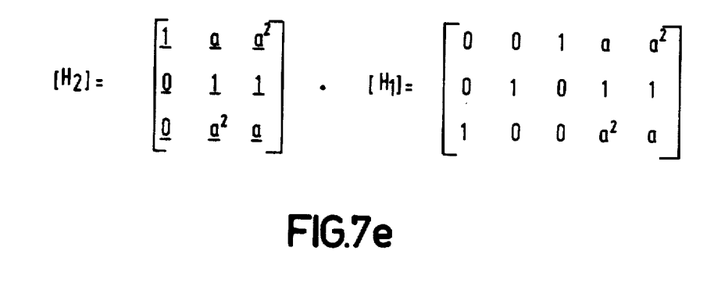

The data-word thus contains two symbols of 2 bits. The code can detect a single symbol error and in the case that two symbols are erroneous it can detect this with 100% certainty. If on grounds of earlier data (statistics) the error locator of one of these two erroneous symbols is known, the other error can be corrected. The matrices are given in FIG. 7d, where a is an element of $GF(2^2)$. Reference is made here to the book of MacWilliams et al., page 326. The latter correction property mentioned above can be realized with a matrix $[H_2]$ according to FIG. 7e. With an erroneous code-word $\vec{C}^* = \vec{C} + \vec{e}$, both matrices [H] give a syndrome vector. The error locator of $\vec{C}^*$ is numbered as follows (for the five symbols): $\vec{C}^* \simeq (43210)$. If the known locator (i.e. of the "old" error) has the value 0, 1 or 2 then $[H_1]$ is used, and only those rows on which the known error has no effect. If the known locator has the value "0", only the upper two rows are thus used. If the known locator is "1", only the odd rows, if it is "2", only the lower two rows. If the locator of the known error has the value "3" or "4", the matrix $[H_2]$ is used with the corresponding syndrome. It has been shown that the device as illustrated in FIG. 3 and the extensions dealt with therein offer an additional possibility for correcting errors over and above the correction of an erroneous four-bit symbol. The extension is based on the fact that an error in a processor produces an erroneous symbol. An error in one of the memory sectors also produces an erroneous symbol, but usually this relates only to a single bit of this multi-bit symbol. It seems to be possible, in the case where the location of an erroneous symbol (but not the magnitude of the fault) is known, to also correct a one-bit error in the rest of the code word.

The reconstruction sections are controlled in one of two possible working modes:

(a) The "normal mode" as described in FIG. 3: all the errors where 1 symbol is erroneous are corrected; all the errors where 2 bits are erroneous in different error-isolation areas are detected, of which a number can also be corrected; some of the multi-symbol errors are corrected.

(b) The "erase" method wherein one of the symbols whose location in the code word is known is noted as being "erased" is not taken further into consideration. In all the information reconstruction sections the bits of the "erased" symbol are, for example, continuously processed as zeros. The error-isolation area from which the relevant "erased" symbol originates may then be completely deactivated (even switched off). The following now applies: all one-bit errors in the other symbols are corrected; a small number of more complicated errors are detected.

In one embodiment the parity matrix has the following form in which a is here one element of the Galois field $GF(2^4)$:

$$[H] = \begin{bmatrix} a^0 & a^0 & a^0 & a^0 \\ a^{10} & a^5 & a^0 & 0 \end{bmatrix}$$

It is pointed out that the elements $0, a^0, a^5, a^{10}$ form a sub-field of the Galois field $GF(2^4)$: they are interrelated by the four elementary algebraic operations. The generator matrix has the form:

$$[G] = \begin{bmatrix} a^0 & 0 \\ 0 & a^0 \\ a^{10} & a^5 \\ a^5 & a^{10} \end{bmatrix}$$

It is also pointed out that the properties of the code remain unchanged if the parity matrix is multiplied by a non-singular matrix [A] in order to form a new parity matrix: in fact, the generator matrix, and its code, remain unchanged. It is also possible for permutations to be made in the parity matrix [H] columns. This means that code words are also permutated. The latter changes in the parity matrix bring about corresponding changes in the generator matrix because [G]·[H]=0.

Generator matrix and parity matrix are implemented in the corresponding manner as described above. The replacement of a bit of arbitrary, but possibly erroneous, value by a logic "0" is easy to bring about, because the relevant bit is not used for the addressing of the read-only memory executing the information reconstruction. On the other hand, it is also possible to incorporate a switch in the relevant connection or by selectively activating the amplifiers 36, 38, 42, 44 in FIG. 3. If the abovementioned switch is open and, the amplifier is therefore deactivated, this means that the information there only contains zeros.

Switching from the "normal" mode to the "erase" mode can be done as follows: if a symbol error is corrected, an indication is given (see above) to show in which symbol, i.e., in which error-isolation area the fault has occurred. These indication signals are fed to a bookkeeping device. This may be a special processor, or even be embodied in processor means which, each time, are included in each error-isolation area. These are not indicated in the figures, but the processor, which is indicated, will usually have sufficient processing capacity. It is favorable therefore for the processors to have means for reading out each other's error registers so as to learn errors detected by other error-isolation areas. If now, for example, a given error-isolation area in a sequence of successively processed code words has been faulted at least a predetermined number of times, for example 4, this isolation area is considered to be "doubtful". If then the second case as listed under (a) occurs, switchover takes place to the "erase" mode and the "doubtful" error-isolation area is ignored. In the erase mode it may happen that as a result of a repeat operation the second case set out under (a) is still corrected. If, in the above series of code words, the same error-isolation area has been faulted even more frequently, for example at least 8 times, the device switches directly over to the "erase" mode. Return to the "normal" mode can be controlled in various ways. One possibility is the application of an external reset signal if a faulty error-isolation area is restored. Another possibility is to make intermittent attempts to switch back. It should be pointed out that the latter combination of generator matrix and parity matrix is only one example; also with other numbers of symbols per code word or bits per symbol it is possible to offer an extra possibility for correction of errors if a single localized symbol can be completely disregarded in an "erase" mode.

The components needed for the correction methods according to FIGS. 1 to 4 are not shown; they are designed in a similar way to those in FIGS. 2, 3, 5, 6. To correct a code word an information reconstruction section can contain a read-only memory that is addressed by the entire code word and yields the desired information bits at its output. The selected information that indicates whether the system is working in the "normal" or the "erase" mode, can together with the information (in FIG. 3, two bits) which indicates the "erased" error-isolation area, can function as additional address bits for this read-only memory.

What is claimed is:

1. A multiprocessor computer system for processing data words, each word having k data symbols, said computer system comprising a plurality of n parallel operating and mutually synchronized computer modules, each computer module including a processor module for processing the data words and having a first data input and a first data output, an encoder module fed by said first data output for receiving a processed data word and therefrom generating a code symbol on a second output, a local memory module fed by said encoder module for temporarily storing code symbols and having a third data output, and a data word reconstruction module for receiving a plurality of n code symbols for reconstructing therefrom a data word, said data word reconstruction module having a fourth data output connected to said first data input, said multiprocessor furthermore comprising an interconnection network connecting all said third data outputs to respective second data inputs of all respective data word reconstruction modules, wherein all data symbols and code symbols consist of a plurality of b bits, wherein the respective code symbols generated from one data word constitute an n-symbol code word, the set of code words having a code distance D as defined over the code symbols of at least three, and wherein the relation between n, D and k is given by $D \cdot k - (D-1) > n - (D-1) \geq k \geq 2$.

2. Multi-processor computer system according to claim 1, in which the value of n is given by $n = k + D - 1$, whereby for $D = 4$, $b \geq \log^2 (n-2)$ but otherwise $b \geq \log^2(n-1)$.

3. Multi-processor computer system according to claim 1, in which the values of D, b, k and n are given by the relations:

$$D = 3, n = k + 2, b \geq \log^2(n-1).$$

4. Multi-processor computer system according to claim 3, in which the values of b, k and n are given by the relations:

$$n = 4, k = 2, b \geq 2.$$

5. A multiprocessor computer system as claimed in claim 3, wherein (n−2) encoder modules allow for direct transmission of (n−2) data symbols as constituting respective code symbols.

6. A multiprocessor computer system as claimed in claim 1, wherein each data word reconstruction module has a holding register for temporarily holding a complete code word as received.

7. A multiprocessor computer system as claimed in claim 1, wherein at least one of the data word reconstruction modules is provided with a signal output for signalling a detected error.

8. Multiprocessor computer system as claimed in claim 1, wherein for the attachment of a peripheral equipment in a first computer module the associated processor module is provided with an outgoing data word line and at least one outgoing control line for a synchronization signal for that peripheral equipment, while in all computer modules the associated processor module is provided with a respective incoming control line for a second synchronization signal and a respective incoming data word line from that peripheral equipment, and wherein all said incoming control lines and incoming data word lines are provided with respective switches privy to a respective computer module and responsive to a switching control signal from the associated processor module.

9. Multiprocessor computer system as claimed in claim 1, wherein for the attachment of a peripheral equipment in each computer module the associated encoder module is provided with an outgoing code symbol line and the associated processor module is provided with at least one outgoing control line for a control signal for the peripheral equipment and a second encoder encompassed in said outgoing control line and furthermore with a respective incoming line for a second synchronization signal and a respective incoming data word line from the peripheral equipment, wherein the peripheral equipment is provided with a second data word reconstruction module for receiving the code symbols on the repective code symbol lines and for therefrom reconstructing a data word and a control word reconstruction module fed by the respective second encoders of all computer modules for reconstructing a control word, while using the same symbols correcting code as the one used for encoding the data word, and wherein all said incoming control lines and incoming data word lines are provided with respective switches privy to a respective computer module and responsive to a switching control signal from the associated processor module.

10. Multiprocessor computer system as claimed in claim 1, wherein for the attachment of a peripheral equipment in each computer module the associated encoder module is provided with an outgoing code symbol line and the associated processor module is provided with at least one outgoing control line for a control signal for that peripheral equipment and a second encoder encompassed in said outgoing control line and furthermore with a respective incoming control line for a second synchronization signal from that peripheral equipment, and wherein in each computer module the data word reconstruction module is provided with an incoming code word input line from that peripheral equipment, wherein the peripheral equipment is provided with a second data word reconstruction module for receiving the code symbols on the respective code symbol lines and for therefrom reconstructing a data word and a control word reconstruction module fed by the respective second encoders of all computer modules for reconstructing a control word while using the same symbol correcting code as the one used for encoding the data word, and wherein the peripheral equipment is provided with a third encoder for generating from a data word received therein a code word of a code symbol correcting code as in the respective computer modules for forwarding to the data word reconstruction modules, and wherein all said incoming code word input lines are provided with respective switching devices privy to a respective computer module and responsive to a switching control signal from the associated processor module.

11. Multiprocessor computer system as claimed in claim 1, wherein for the attachment of a peripheral equipment in each computer module the associated encoder module is provided with an outgoing code symbol line and the associated processor module is provided with at least one outgoing control line for a control signal for that peripheral equipment and a second encoder encompassed in said outgoing control line and furthermore with a respective control decoder fed by a plurality of incoming control lines for second synchronization signals from that peripheral equipment, and wherein in each computer module the data word reconstruction module is provided with an incoming code word input line from that peripheral equipment, wherein the peripheral equipment is distributed over a second number of peripheral modules each peripheral module having a second data word reconstruction module for receiving the code symbols on the respective code symbol lines and for reconstructing therefrom a data word and a control word reconstruction module fed by the respective second encoders of all computer modules for reconstructing a control word while using the same symbol correcting code as the one used for encoding the data word, and wherein each peripheral module is provided with a third encoder for generating from a second data word received therein a second code word symbol, the set of second code word symbols constituting a second code word associated to the second data according to a symbol correcting code, for forwarding to the respective computer modules, and having an outgoing control line cum fourth encoder for encoding at least one second control signal, the set of encoded second control signals constituting a control word for forwarding to the respective computer modules, and wherein all said incoming code word input lines are provided with respective first switching devices privy to a respective computer module and responsive to a switching control signal from the associated processor module, and wherein the feeding lines to said control decoders are provided with respective second switching devices privy to a respective computer module and responsive to a switching control signal from the associated processor module.

12. Multiprocessor computer system as claimed in claim 11, wherein there are n peripheral modules.

13. Multiprocessor computer system as claimed in claim 1, wherein at least one of the data word reconstruction modules is provided with a signal output for signalling and locating by computer module a data word error, further providing holding means for holding and locating signal and erase control means steered by said locating signal, and output of said erase control means being connected to respectively data word reconstruction modules for therein erasing a code word symbol generating by a computer module identified by said locating signal, the respective data word reconstruction modules then operating according to a single bit correcting code in that the generator matrix for the code symbols of the symbol correcting code comprise only symbols that lie in a Galois sub-field of the Galois field containing the data symbols.

* * * * *